United States Patent
Sheng et al.

(10) Patent No.: US 10,062,641 B2
(45) Date of Patent: Aug. 28, 2018

(54) INTEGRATED CIRCUITS INCLUDING A DUMMY METAL FEATURE AND METHODS OF FORMING THE SAME

(71) Applicant: Globalfoundries Singapore Pte. Ltd., Singapore (SG)

(72) Inventors: Haifeng Sheng, Singapore (SG); Shifeng Zhao, Singapore (SG); Juan Boon Tan, Singapore (SG); Soh Yun Siah, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/263,830

(22) Filed: Sep. 13, 2016

(65) Prior Publication Data
US 2018/0076128 A1    Mar. 15, 2018

(51) Int. Cl.
| | |
|---|---|
| *H01L 27/11551* | (2017.01) |
| *H01L 23/522* | (2006.01) |
| *H01L 23/528* | (2006.01) |
| *H01L 27/115* | (2017.01) |
| *H01L 21/768* | (2006.01) |

(52) U.S. Cl.
CPC .... *H01L 23/5225* (2013.01); *H01L 21/76816* (2013.01); *H01L 21/76877* (2013.01); *H01L 23/528* (2013.01); *H01L 23/5226* (2013.01); *H01L 27/115* (2013.01)

(58) Field of Classification Search
CPC ................................................. H01L 27/11551
See application file for complete search history.

(56) References Cited

U.S. PATENT DOCUMENTS

| | | | |
|---|---|---|---|
| 2009/0315187 A1* | 12/2009 | Cho | H01L 23/481 257/773 |
| 2010/0012997 A1* | 1/2010 | Jang | H01L 27/11524 257/315 |

* cited by examiner

*Primary Examiner* — Peniel M Gumedzoe
*Assistant Examiner* — Christopher Johnson
(74) *Attorney, Agent, or Firm* — Lorenz & Kopf, LLP

(57) ABSTRACT

Integrated circuits and methods of forming the same are provided herein. In an embodiment, an integrated circuit includes a semiconductor substrate that has an isolated well. A multilayer metallization stack overlies the semiconductor substrate. The multilayer metallization stack includes a metal layer, a functional via, and a dummy metal feature. The metal layer includes a first line in electrical communication with the isolated well through a contact. The functional via is in electrical communication with the first line and the contact. The dummy metal feature is in electrical communication with the functional via.

16 Claims, 2 Drawing Sheets

INTEGRATED CIRCUITS INCLUDING A DUMMY METAL FEATURE AND METHODS OF FORMING THE SAME

TECHNICAL FIELD

The technical field generally relates to integrated circuits that include a dummy metal feature and methods of forming the same. More particularly, the technical field relates to integrated circuits that include a dummy metal feature to minimize galvanic corrosion and metal void formation in other metal features during fabrication of the integrated circuit.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a well in a semiconductor substrate and spaced-apart source and drain regions in the well between which a current can flow. In addition to MOS transistors, ICs often contain various additional devices such as, e.g., non-volatile memory (NVM) devices.

During formation of certain features in integrated circuits, such as NVM devices, electrical charges can build up and become trapped in isolated wells of the semiconductor substrate. For example, conventional NVM arrays are formed in and on isolated p-wells that are doped with p-type ions. The isolated p-wells are generally isolated by n-wells that are immediately adjacent to and beneath the isolated p-wells. As a result, electrical charges can become trapped in the isolated p-wells. During subsequent back-end-of-line (BEOL) fabrication of metallization layers, various metal features may be formed that are in electrical connection with the isolated p-wells and the adjacent n-wells, respectively. While the metal features that are in electrical connection with the isolated p-wells and the adjacent n-wells are ordinarily insulated from electrical communication with each other, surfaces of the metal features may be exposed during etching/cleaning and an electrical circuit may thus be completed between the isolated p-well and the adjacent n-wells by solvent (e.g., dilute hydrofluoric acid) employed to clean the various layers. As a result of forming the electrical circuit through the solvent, galvanic corrosion may occur in various metal features, especially in vias connecting to higher levels of metal layers where a significantly smaller number of vias are employed as compared to vias connecting to lower levels of metal layers. The galvanic corrosion leads to metal void formation in the affected metal features, ultimately resulting in compromised function of the integrated circuits. Additionally, galvanic corrosion is generally more prevalent in metal features that are in electrical communication with the isolated p-well.

The conventional approach to releasing the trapped electrical charges from isolated wells is to provide a tie-down diode in electrical communication with the isolated well and a ground. However, such diodes are not suitable for certain devices that employ high voltages during intended usage. The tie-down diodes function by discharging current when the voltage in the isolated well exceeds a design voltage of the tie-down diode. In NVM devices, relatively high voltages that generally exceed the voltage limits for the tie-down diodes are often employed during programming. Because tie-down diodes effectively release current upon exceeding the voltage threshold of the diodes, the maximum voltage that can be introduced into the isolated well is the voltage threshold of the tie-down diode and programming of the NVM devices would therefore not be possible with use of tie-down diodes.

Accordingly, it is desirable to provide integrated circuits that exhibit minimal metal void formation due to galvanic corrosion during fabrication of the integrated circuits without the use of tie-down diodes. Furthermore, other desirable features and characteristics will become apparent from the subsequent detailed description and the appended claims, taken in conjunction with the accompanying drawings and this background.

BRIEF SUMMARY

Integrated circuits and methods of forming the same are provided herein. In an embodiment, an integrated circuit includes a semiconductor substrate that has an isolated well. A multilayer metallization stack overlies the semiconductor substrate. The multilayer metallization stack includes a metal layer, a functional via, and a dummy metal feature. The metal layer includes a first line in electrical communication with the isolated well through a contact. The functional via is in electrical communication with the first line and the contact. The dummy metal feature is in electrical communication with the functional via.

In another embodiment, an integrated circuit includes a semiconductor substrate having an isolated p-well. The isolated p-well is isolated by n-doped regions immediately adjacent to the isolated p-well in the semiconductor substrate and is further isolated by a deep n-well underlying the isolated p-well. A body contact is in electrical communication with one or more of the n-doped regions that are immediately adjacent the isolated p-well. A non-volatile memory device is disposed in and on the isolated p-well. A multilayer metallization stack overlies the semiconductor substrate. The multilayer metallization stack includes a metal layer, a functional via, and a dummy metal feature. The metal layer includes a first line in electrical communication with the isolated p-well through a contact and a second line in electrical communication with the body contact. The first line and the second line are isolated from direct electrical communication by adjacent portions of interlayer dielectric layers. The functional via is in electrical communication with the first line and the contact. The dummy metal feature is in electrical communication with the functional via.

In another embodiment, a method of forming an integrated circuit includes providing a semiconductor substrate having an isolated well. A multilayer metallization stack is formed overlying the semiconductor substrate. The multilayer metallization stack includes a metal layer, a functional via, and a dummy metal feature. The metal layer includes a first line in electrical communication with the isolated well through a contact. The functional via is in electrical communication with the first line and the contact. The dummy metal feature is in electrical communication with the functional via.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits and methods of forming the integrated circuits as set forth in the accompanying claims. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Integrated circuits and methods of forming the integrated circuits are provided herein with the integrated circuits having an isolated well. The integrated circuits exhibit minimal metal void formation due to galvanic corrosion during fabrication of the integrated circuits without the need to use tie-down diodes. In particular, a dummy metal feature is provided in electrical communication with a functional via in a back-end-of-line metallization stack. The dummy metal feature may be located at the same level in the metallization stack as the functional via (or may be part of a metal layer to which the functional via directly contacts). The dummy metal feature mitigates metal void formation due to galvanic corrosion by effectively spreading out the impact of galvanic corrosion over a larger area at metallization levels of concern, especially in vias connecting to higher levels of metal layers, such as at the M2 or M3 level, where a significantly smaller number of vias are employed as compared to vias connecting to lower levels of metal layers. The dummy metal feature, as referred to herein, may be a non-connecting via and/or a portion of a metal line that is in electrical communication with a functional via at the same level thereof in the metallization stack but that is effectively "open" and isolated from flow of electrical current therethrough. As referred to herein, a "functional via" is a via or interconnect that facilitates electrical communication between two metal lines. Unlike the functional via, the dummy metal feature is free from a serial electrical connection such that electrical current does not flow between any features within the metallization stack through the dummy metal feature.

Figure 1:
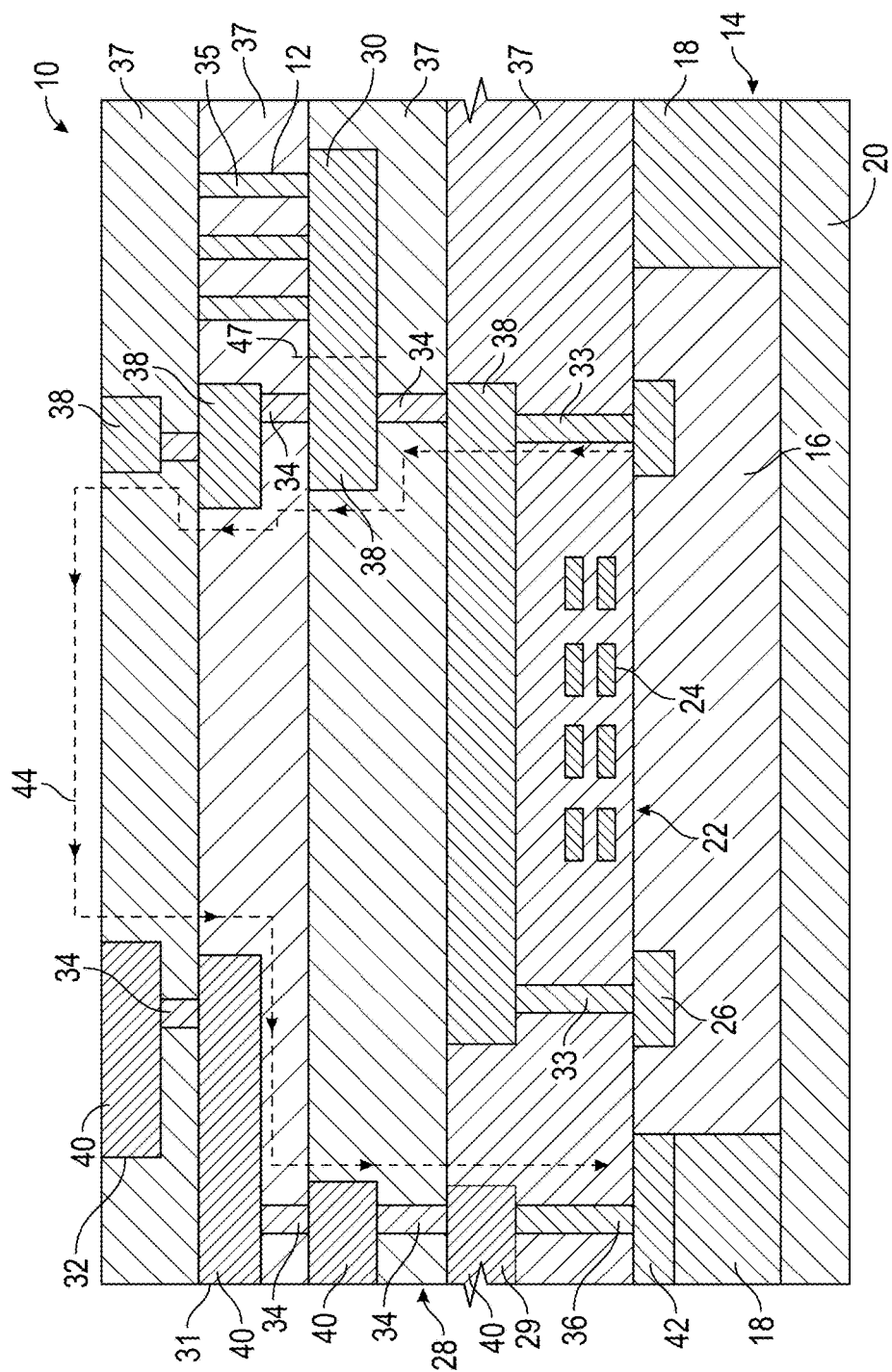
FIG. 1 is a schematic cross-sectional side view of an integrated circuit including a dummy metal feature in accordance with an embodiment.

Referring to FIG. 1, an exemplary embodiment of an integrated circuit 10 including a dummy metal feature 12 is shown. It is to be appreciated that the view of FIG. 1 is a sectional view showing only a portion of the integrated circuit 10. Referring to FIG. 1, the integrated circuit 10 includes a semiconductor substrate 14. The semiconductor substrate 14 includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least 10 weight percent or more based on the total weight of the material unless otherwise indicated. In embodiments, the semiconductor substrate 14 primarily includes a monocrystalline semiconductor material. The semiconductor substrate 14 may be a bulk silicon wafer (as illustrated) or may be a thin layer of silicon on an insulating layer (commonly known as silicon-on-insulator or SOI, not illustrated) that, in turn, is supported by a carrier wafer.

Referring again to FIG. 1, the semiconductor substrate 14 has an isolated well 16. By "isolated well", it is meant that a portion of the semiconductor substrate 14 is completely insulated from other like portions of the semiconductor substrate 14 by regions within the semiconductor substrate that prevent the flow of electrical charges from the isolated well 16 to the other like portions of the semiconductor substrate. In embodiments, the isolated well 16 is an isolated p-well 16 that contains p-type ions. Examples of p-type ions include, but are not limited to, boron, aluminum, gallium, and indium. In the embodiment as shown in FIG. 1, the isolated p-well 16 is isolated by n-doped regions 18 that are immediately adjacent to the isolated p-well in the semiconductor substrate 14. Examples of n-type ions include, but are not limited to, arsenic, phosphorus, or antimony. Additionally, the isolated p-well is further isolated by a deep n-well 20 underlying the isolated p-well 16.

In the embodiment shown in FIG. 1, the integrated circuit 10 further includes a non-volatile memory (NVM) device 22 disposed in and on the isolated well 16. The NVM device 22 may be a conventional NVM device including memory elements 24 and heavily doped contact regions 26 formed in the isolated well 16, with the heavily doped contact regions 26 including the same dopant type as the isolated well (e.g., p-type dopant for the isolated p-well). However, it is to be appreciated that other types of devices may be formed in and on the isolated well 16, and it is further to be appreciated that other portions of the integrated circuit 10, although not shown, may include various other types of devices. In embodiments, the integrated circuit 10 is free of a diode in direct electrical communication with the isolated well 16 and distinct from an interface between the isolated well 16 and the adjacent n-doped regions 18 and deep n-well well, particularly in embodiments in which the NVM device 22 is disposed in and on the isolated well 16.

Referring again to FIG. 1, the integrated circuit 10 further includes a multilayer metallization stack 28 overlying the semiconductor substrate 14. The metallization stack 28 is formed during a back end-of-the-line (BEOL) semiconductor fabrication process whereby devices, such as the NVM device 22 and other devices such as transistors (not shown), are connected by a network of electrically-conductive metal layers and vias. The metallization stack 28 includes various levels of electrically-conductive metal layers 29, 30, 31, 32 and associated vias 34, 35 and contacts 33, 36 that are insulated by interlayer dielectric layers 37. "Electrically-conductive metal layers", as referred to herein, contain a metal and have a resistivity of about $1\times10^{-4}$ ohm meters or less. Suitable metals that may be employed in the electrically-conductive metal layers include, but are not limited to, copper, aluminum, silver, and alloys thereof.

In embodiments and as shown in FIG. 1, contacts 33 are in electrical communication with the heavily doped contact regions 26 and body contact 36 is in electrical communication with the n-doped region 18 that is immediately adjacent to the isolated well 16, optionally through a heavily doped n-type region 42. In the embodiment shown in FIG. 1, four metal layers 29, 30, 31, 32 are provided, and each of the metal layers includes a first line 38 that is in electrical communication with the contact 33, and thus the isolated well 16, and a second line 40 that is in electrical communication with the body contact 36, and thus the n-doped region 18. The first line 38 and the second line 40 of each metal layer 29, 30, 31, 32 are electrically isolated from direct electrical communication with each other by adjacent portions of interlayer dielectric layers 37. The first lines 38 of each metal layer 29, 30, 31, 32 are electrically connected to first lines 38 overlying and underlying metal layers 29, 30, 31, 32, as are the second lines 40. As referred to herein, the terms "over" or "overlying" are understood to mean that an intervening layer may lie between the overlying structure and the underlying structure, or "on" such that the overlying structure directly contacts the underlying structure. As used herein, the terms "directly over" or "directly overlying" mean that the recited features are disposed such that a vertical line passing through the upper component also passes through the lower component, with at least a portion of the upper component directly over at least a portion of the lower component.

Each of the metal lines 38, 40 includes a functional via 34 connected thereto. In embodiments, the functional via 34 is disposed in series between a line of one metal layer and another line of another overlying or underlying metal layer of the integrated circuit 10. It is to be appreciated that millions of vias are generally disposed between individual metal layers, especially at lower levels in the metallization stack 28 (such as between metal layer 29, which is often referred to as the M1 layer, and metal layer 30, which is often referred to as the M2 layer). However, exponentially more vias are generally present between lower levels of metal layers than between upper levels of metal layers (such as between metal layer 31, often referred to as the M3 layer, and metal layer 32, often referred to as the M4 layer). During BEOL fabrication of the integrated circuit 10, galvanic corrosion can occur due to various metal features being exposed during etching/cleaning and an electrical circuit may thus be completed between the isolated p-well 16 and the adjacent n-doped region 18 by solvent (e.g., dilute hydrofluoric acid), with the electrical circuit illustrated at 44. The impact of galvanic corrosion generally becomes amplified at higher levels of metal layers and associated vias, such as at metal layer 31 and the functional via 34 between the first line 38 of metal layer 31 and the first line 38 of metal layer 30, because those metal lines and vias have significantly less total surface area than a total surface area of metal lines and vias at lower levels.

In accordance with the integrated circuits as described herein, and as alluded to above, the integrated circuit 10 includes the dummy metal feature 12. The dummy metal feature is in electrical communication with one or more of the functional vias 34. As alluded to above, the dummy metal feature 12 may be a non-connecting via 35 and/or a portion of the first line 38 at issue that is in electrical communication with the functional via 34 at the same level thereof in the metallization stack 28 but that is effectively "open" and isolated from flow of electrical current therethrough to other metal features with line 47 indicating the portion of the first line 38 that is effectively "open". More particularly, the dummy metal feature 12 may either be part of the associated metal layer 30 or the dummy metal feature 12 may be a metal feature that is separate from the metal layer 30, such as a non-connecting via 35, but in direct physical contact with the associated metal layer 30, e.g., the first line 38 of metal layer 30 in the embodiment shown in FIG. 1. For example, in embodiments, the dummy metal feature 12 is chosen from a non-connecting via 35, a sacrificial portion of the first line 38 (as demarcated by line 47), or a combination thereof. The dummy metal feature 12 effectively mitigates metal void formation due to galvanic corrosion in the associated functional via 34 by spreading out the impact of galvanic corrosion over a larger metal line and/or via area at metal layers of concern. Because galvanic corrosion becomes increasingly problematic in successive metallization levels and associated vias, in embodiments, at least one intervening metal layer, or at least two intervening metal layers, is/are disposed between the metal layer associated with the dummy metal feature 12 and the semiconductor substrate 14. For example, in the embodiment shown in FIG. 1, dummy metal feature 12 is in direct electrical communication with the functional via 34 that is disposed between the first line 38 of metal layer 31 and the first line 38 of metal layer 30. Metal layer 29 is disposed between metal layer 30 and the semiconductor substrate 14, with metal layer 30 associated with the dummy metal feature 12. However, it is to be appreciated that the dummy metal feature 12 may be associated with any metal layer in the metallization stack 28.

Figure 2:
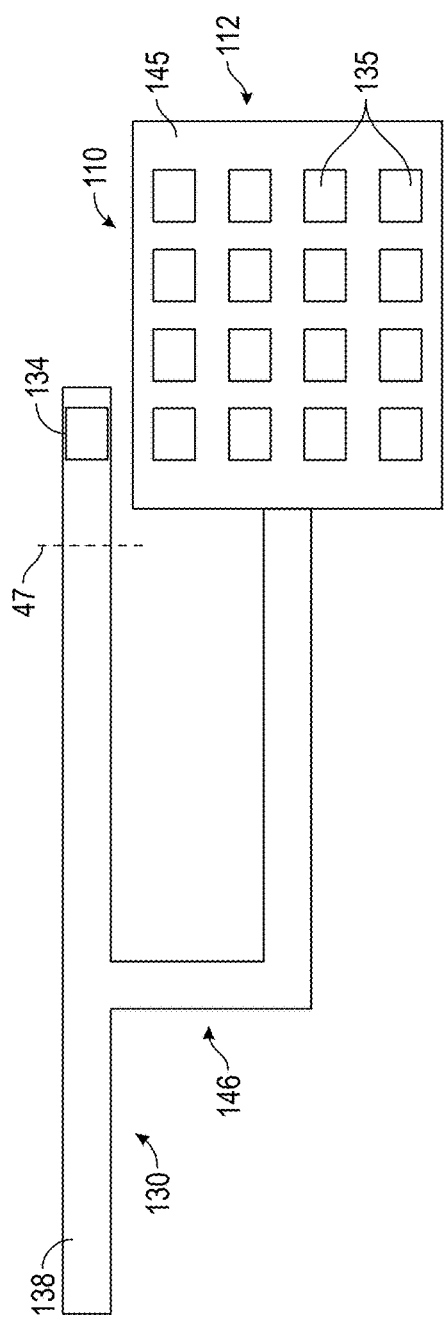
FIG. 2 is a schematic top view of a portion of an integrated circuit including a functional via and dummy metal features in accordance with another embodiment.

Referring to FIG. 2, a portion of an integrated circuit 110 is shown including a functional via 134 and a dummy metal feature 112 in accordance with another embodiment. In this embodiment, the dummy metal feature 112 includes a plurality of non-connecting vias 135 in electrical communication with the first line 138 and the functional via 134. The plurality of non-connecting vias 135 is arranged in an array at an expanded portion 145 of the first line 138. The expanded portion 145 is in electrical communication with the functional via 134 through a branched portion 146 of the first line 138, with the expanded portion 145 and the branched portion 146 also included as part of the dummy metal feature 112 because those features are effectively "open" features within the metal layer 130. In other embodiments, it is to be appreciated that the expanded portion 145 and the branched portion 146 of the first line 138 may be provided as a sacrificial portion of the first line 138 alone in the absence of non-connecting vias 135, with the expanded portion 145 and the branched portion 146 still effectively spreading out the impact of galvanic corrosion over a larger metal area at the metal layer 130 of concern.

Figure 3:
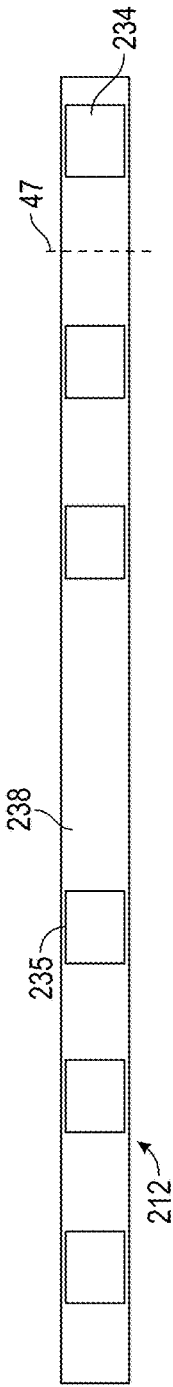
FIG. 3 is a schematic top view of a portion of an integrated circuit including a functional via and dummy metal features in accordance with another embodiment.

In another embodiment as shown in FIG. 3, non-connecting vias 235 may be spaced along the first line 238 at locations that do not directly underlie an overlying metal layer, similar to the configuration shown in FIG. 1. In this embodiment, the non-connecting vias 235 and associated portions of the first line 238 may be included in the dummy metal feature 212, with functional via 234 also shown.

An exemplary method of forming the integrated circuit 10 as shown in FIG. 1 may include providing the semiconductor substrate 14 that includes the isolated well 16, as described above, through conventional techniques. The multilayer metallization stack 28 is formed overlying the semiconductor substrate 14. The multilayer metallization stack 28 may be formed by sequentially depositing the interlayer dielectric material over the semiconductor substrate 14 to form interlayer dielectric layers 37, etching trenches (not shown) corresponding to the lines 38, 40 of the metal layer 29 and the associated functional vias 34 or contacts 33, 36, filling the trenches with an electrically-conductive metal composition to form the metal layer 29 and the functional via 34 or contacts 33, 36, and repeating the process to form the other metal layers 30, 31, 32. Additionally, trenches corresponding to the dummy metal feature 12 are etched in the interlayer dielectric layer at appropriate locations as described above and the dummy metal feature 12 is formed concurrent with filling of the trenches to form the associated metal layer 29, 30, 31, or 32 and functional via 34. Interlayer dielectric material is subsequently deposited over the metal layer 30 and associated dummy metal feature 12 and trenches etched therein with surfaces of the first line 38 and the second line 40 exposed in the trenches, thus giving rise to potential galvanic corrosion in the functional via 34. However, the dummy metal feature 12 remains masked by the interlayer dielectric layer 37 to avoid subsequent connection to an upper metal layer, as shown in FIG. 1.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit comprising:
   a semiconductor substrate comprising an isolated well;
   a multilayer metallization stack overlying the semiconductor substrate, wherein the multilayer metallization stack comprises:
      a metal layer comprising a first line in electrical communication with the isolated well through a contact;
      a functional via in electrical communication with the first line and the contact, and
      a dummy metal feature in electrical communication with the functional via, wherein the dummy metal feature comprises a plurality of non-connecting vias in electrical communication with the first line and the functional via.

2. The integrated circuit of claim 1, wherein the functional via is disposed in series between the first line and another line of another metal layer of the integrated circuit.

3. The integrated circuit of claim 1, wherein the dummy metal feature is an open metal feature.

4. The integrated circuit of claim 1, wherein the dummy metal feature is chosen from a non-connecting via, a sacrificial portion of the first line, or a combination thereof.

5. The integrated circuit of claim 1, wherein the plurality of non-connecting vias is arranged in an array at an expanded portion of the first line.

6. The integrated circuit of claim 1, wherein at least one intervening metal layer is disposed between the metal layer and the semiconductor substrate.

7. The integrated circuit of claim 1, further comprising a non-volatile memory device disposed in and on the isolated well.

8. The integrated circuit of claim 1, free of a diode in direct electrical communication with the isolated well.

9. The integrated circuit of claim 1, wherein the isolated well is an isolated p-well.

10. The integrated circuit of claim 9, wherein the isolated p-well is isolated by n-doped regions immediately adjacent the isolated p-well in the semiconductor substrate.

11. The integrated circuit of claim 10, wherein the isolated p-well is further isolated by a deep n-well underlying the isolated p-well.

12. The integrated circuit of claim 10, further comprising a body contact in electrical communication with one or more of the n-doped regions immediately adjacent the isolated p-well.

13. The integrated circuit of claim 12, wherein the metal layer further comprises a second line in electrical communication with the body contact, wherein the first line and the second line are isolated from direct electrical communication by adjacent portions of interlayer dielectric layers.

14. An integrated circuit comprising:
   a semiconductor substrate comprising an isolated well;
   a multilayer metallization stack overlying the semiconductor substrate, wherein the multilayer metallization stack comprises:
      a metal layer comprising a first line in electrical communication with the isolated well through a contact;
      a functional via in electrical communication with the first line and the contact, and
      a dummy metal feature in electrical communication with the functional via, wherein the dummy metal feature comprises an expanded portion of the first line as a sacrificial portion of the first line, and wherein the expanded portion is in electrical communication with the functional via through a branched portion of the first line.

15. An integrated circuit comprising:
   a semiconductor substrate comprising an isolated p-well, wherein the isolated p-well is isolated by n-doped regions immediately adjacent the isolated p-well in the semiconductor substrate and by a deep n-well underlying the isolated p-well;
   a body contact in electrical communication with one or more of the n-doped regions immediately adjacent the isolated p-well;
   a non-volatile memory device disposed in and on the isolated p-well;
   a multilayer metallization stack overlying the semiconductor substrate, wherein the multilayer metallization stack comprises:
      a metal layer comprising:
         a first line in electrical communication with the isolated p-well through a contact; and
         a second line in electrical communication with the body contact, wherein the first line and the second line are isolated from direct electrical communication by adjacent portions of interlayer dielectric layers;
      a functional via in electrical communication with the first line and the contact; and
      a dummy metal feature in electrical communication with the functional via, wherein the dummy metal feature comprises a plurality of non-connecting vias in electrical communication with the first line and the functional via.

16. The integrated circuit of claim 15, free of a diode in direct electrical communication with the isolated p-well.

* * * * *